United States Patent
Martín de Los Santos

(10) Patent No.: US 11,552,652 B2
(45) Date of Patent: Jan. 10, 2023

(54) SYSTEMS AND METHODS FOR LOSSLESS COMPRESSION OF TABULAR NUMERIC DATA

(71) Applicant: Insurance Services Office, Inc., Jersey City, NJ (US)

(72) Inventor: Ismael Aguilera Martín de Los Santos, Madrid (ES)

(73) Assignee: Insurance Services Office, Inc., Jersey City, NJ (US)

( * ) Notice: Subject to any disclaimer, the term of this patent is extended or adjusted under 35 U.S.C. 154(b) by 0 days.

(21) Appl. No.: 17/491,977

(22) Filed: Oct. 1, 2021

(65) Prior Publication Data

US 2022/0109454 A1 Apr. 7, 2022

Related U.S. Application Data

(60) Provisional application No. 63/086,323, filed on Oct. 1, 2020.

(51) Int. Cl.
*H03M 7/00* (2006.01)
*H03M 7/34* (2006.01)
(Continued)

(52) U.S. Cl.
CPC ............ *H03M 7/70* (2013.01); *G06F 3/0608* (2013.01); *G06F 3/0659* (2013.01);
(Continued)

(58) Field of Classification Search
CPC ...... H03M 7/70; H03M 7/6011; H03M 7/707; H03M 7/30; G06F 3/0608; G06F 3/0659; G06F 3/0661; G06F 3/0673
(Continued)

(56) References Cited

U.S. PATENT DOCUMENTS 5,546,575 A    8/1996  Potter et al.
6,424,972 B1 * 7/2002  Berger ................... H03M 7/24
                                            707/999.102
(Continued)

OTHER PUBLICATIONS

International Search Report of the International Searching Authority dated Jan. 13, 2022, issued in connection with International Application No. PCT/US2021/053129 (3 pages).

(Continued)

*Primary Examiner* — Jean B Jeanglaude
(74) *Attorney, Agent, or Firm* — McCarter & English, LLP

(57) ABSTRACT

Systems and methods for lossless compression of tabular numeric data are provided. The system can include one or more data compression servers executing data compression system code to compress the tabular numeric data, a storage database to store the compressed tabular numeric data, and one or more data decompression servers to decompress the tabular numeric data for use. The one or more data compression servers, the storage database, and the one or more data decompression servers can communicate via a communication network. The system can receive the uncompressed tabular numeric data from one or more data generation systems, processes the uncompressed tabular numeric data with the data compression system code, and generate a compressed table of numeric information, which can be stored in the database, or later decompressed by the one or more data decompression servers.

18 Claims, 4 Drawing Sheets

(51) Int. Cl.
 *H03M 7/30* (2006.01)
 *G06F 3/06* (2006.01)
(52) U.S. Cl.
 CPC .......... *G06F 3/0661* (2013.01); *G06F 3/0673* (2013.01); *H03M 7/6011* (2013.01)
(58) Field of Classification Search
 USPC ...................................................... 341/50, 51
 See application file for complete search history.

(56) References Cited

U.S. PATENT DOCUMENTS

| | | | | |
|---|---|---|---|---|
| 7,178,100 | B2* | 2/2007 | Call | G06F 40/149 |
| | | | | 715/210 |
| 8,397,155 | B1* | 3/2013 | Szabo | G06F 40/103 |
| | | | | 715/209 |
| 8,433,997 | B1* | 4/2013 | Szabo | G06F 40/103 |
| | | | | 707/693 |
| 10,333,549 | B1* | 6/2019 | Tamir | H03M 7/6005 |
| 10,340,945 | B2* | 7/2019 | Tamir | H03M 7/4006 |
| 10,673,459 | B1* | 6/2020 | Tamir | H03M 7/3088 |
| 2003/0130855 | A1 | 7/2003 | Babu et al. | |
| 2015/0081748 | A1* | 3/2015 | Hicklin | G06F 40/177 |
| | | | | 707/807 |
| 2015/0378674 | A1 | 12/2015 | Ruff | |
| 2019/0028115 | A1* | 1/2019 | Tamir | H03M 7/4006 |

OTHER PUBLICATIONS

Written Opinion of the International Searching Authority dated Jan. 13, 2022, issued in connection with International Application No. PCT/US2021/053129 (5 pages).
Ratanaworabhan, et al., "Fast Lossless Compression of Scientific Floating-Point Data," Proceedings of the Data Compression Conference, IEEE, Mar. 28, 2006, retrieved on Dec. 4, 2021 from https://ieeexplore.ieee.org/abstract/document/1607248 (10 pages).
Engelson, et al., "Lossless Compression of High-Volume Numerical Data from Simulations," Linkoping Electronic Articles in Computer and Information Science, vol. 5, Dec. 5, 2000, retrieved on Dec. 4, 2021 from https://ep.liu.se/ea/cis/2000/011/cis00011.pdf (16 pages).
Ilkhechi, et al., "DeepSqueeze: Deep Semantic Compression for Tabular Data," Proceedings of the 2020 ACM SIGMOD International Conference on Management of Data, Jun. 14, 2020, retrieved on Dec. 4, 2020 from https://dl.acm.org/doi/abs/10.1145/3318464.3389734 (14 pages).

* cited by examiner

SYSTEMS AND METHODS FOR LOSSLESS COMPRESSION OF TABULAR NUMERIC DATA

RELATED APPLICATIONS

This application claims priority to U.S. Provisional Patent Application Ser. No. 63/086,323 filed on Oct. 1, 2020, the entire disclosure of which is hereby expressly incorporated by reference.

BACKGROUND

Field of the Disclosure

The present disclosure relates generally to the field of data compression. Specifically, the present disclosure relates to systems and methods for lossless compression of tabular numeric data.

Related Art

As society becomes increasingly reliant on digital information, various industries rely on computer-implemented processes that generate vast amounts of numeric digital information, which is subsequently captured, stored, transferred, and analyzed. Keeping this information at rest (e.g., storing), as well as transferring the information from one location to another, can have a high economic cost in terms of both time and computational resource usage, such as, for example, processor cycles, disk space, memory, network bandwidth, and the like. As such, the larger in size that the tabulated digital information becomes, the greater the associated costs that industries and society must bear.

Several data compression systems and file formats, such as DEFLATE, ZIP, and RAR, are currently employed to reduce the size of digital information. However, the compression ratios (e.g., the size of the compressed digital information divided by the size of the original digital information) for these systems are sometimes not sufficient. Moreover, it is difficult to adequately compress data stored in tabular (e.g., table) format using existing compression techniques.

Therefore, there is a need for systems and methods which can reduces the size of tabular digital information, without the loss of any data, so that the digital information can be more easily processed and costs associated with the manipulation of this information can be reduced. These and other needs are addressed by the systems and methods of the present disclosure.

SUMMARY

The present disclosure relates to computer systems and methods for the lossless compression of tabular numeric data. The system can include one or more data compression servers executing data compression system code to compress the tabular numeric data, a storage database to store the compressed tabular numeric data, and one or more data decompression servers to decompress the tabular numeric data for use. The one or more data compression servers, the storage database, and the one or more data decompression servers can communicate via a communication network. The data compression system code can be executed by a processor that receives a table of uncompressed numeric information and generates a table of integers based on the table of uncompressed numeric information. The system can then rewrite each row in the table of integers based on a difference between values in a first row and values in a preceding row. The absolute values for each number in the table of integers can then be converted into base-14 string and the base-14 strings for each number can be concatenated. The system can then write a byte in a new byte array for each pair of characters in the concatenated base-14 string and the new byte array can be exported as a compressed data file.

BRIEF DESCRIPTION OF THE DRAWINGS

The foregoing features of the disclosure will be apparent from the following Detailed Description, taken in connection with the accompanying drawings, in which.

DETAILED DESCRIPTION

The present disclosure relates to computer systems and methods for the lossless compression of tabular numeric data, as discussed in detail below in connection with FIGS. 1-4.

Figure 1:
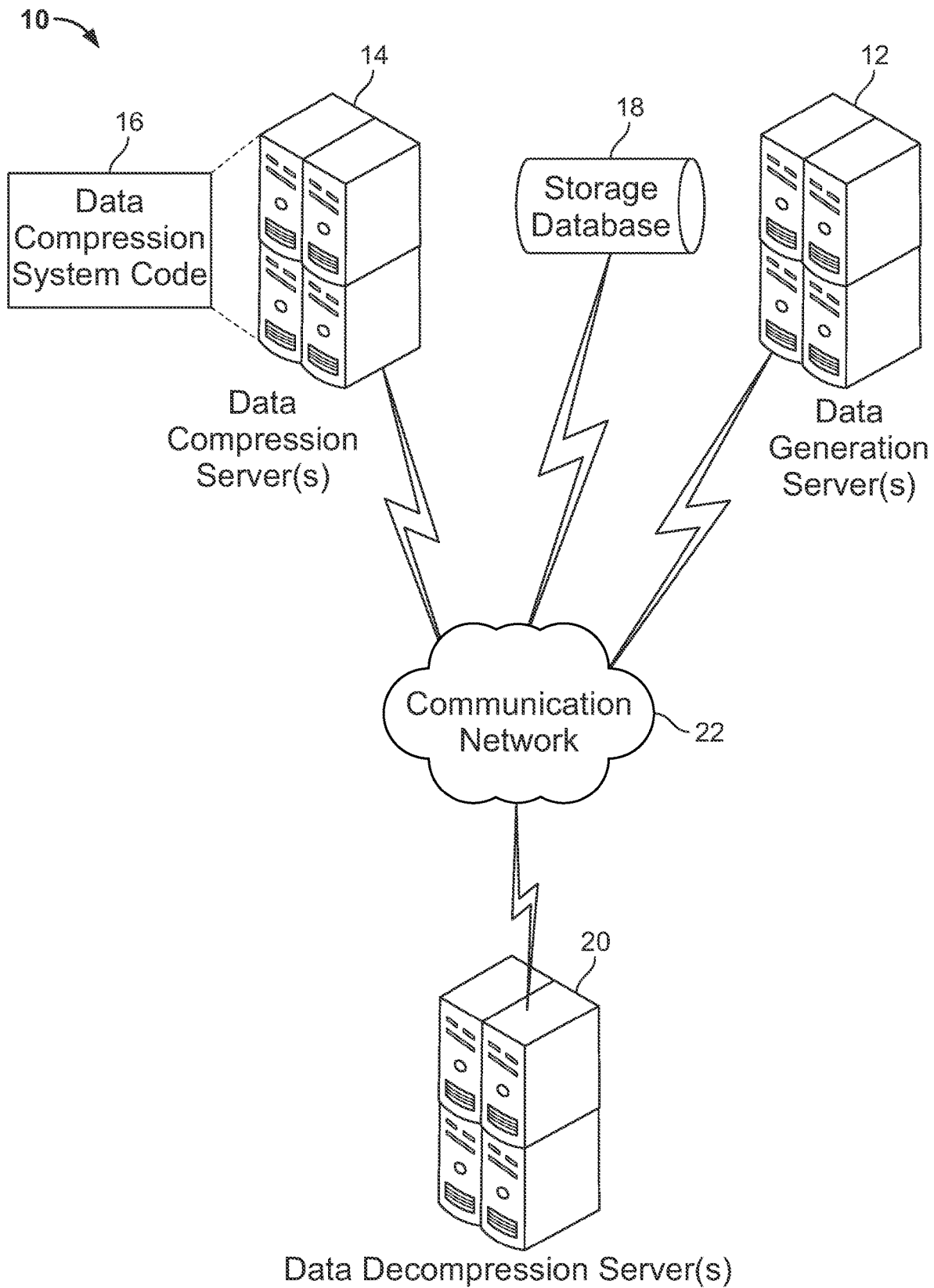
FIG. 1 is a diagram illustrating hardware and software components capable of being utilized to implement the system of the present disclosure.

FIG. 1 is a diagram illustrating one potential configuration of hardware, software, and network components capable of being utilized to implement the system 10 of the present disclosure. As shown, the system 10 can include, or be in communication with, one or more data generation system(s) 12 that produce tabular numeric digital information (hereinafter "digital information"), which is subsequently processed by the components of the system 10 to compress, and later decompress, the digital information. The system 10 can also include one or more data compression server(s) 14 (e.g., encoder(s)) having a central processing unit (e.g., a hardware processor) capable of executing data compression system code 16, a storage database 18 for receiving and storing the compressed digital information from the data compression server(s) 14 until the information needs to be accessed, and one or more data decompression server(s) 20 (e.g., decoder(s)), which can each be embodied as, but are not limited to, a personal computer, a laptop computer, a tablet computer, a smartphone, a server, and/or a cloud-based computing platform. The data generation system(s) 12, data compression server(s) 14, storage database 18, and data decompression server(s) 20 can communicate over a communication network 22 (e.g., LAN, WAN, the Internet). Of course, the system 10 need not be implemented on multiple devices, and indeed, the system 10 can be implemented on a single computer system (e.g., a personal computer, server, mobile computer, smartphone, etc.) without departing from the spirit or scope of the present disclosure.

Still further, the system 10 can be embodied as a customized hardware component such as a field-programmable gate array ("FPGA"), application-specific integrated circuit ("ASIC"), embedded system, or other customized hardware component without departing from the spirit or scope of the present disclosure. It should be understood that FIG. 1 is only one potential configuration, and the system 10 of the present disclosure can be implemented using a number of different configurations. Indeed, the tabular compression and decompression features of the present disclosure could be carried out by a single computer system, or multiple computer systems operating together.

Figure 2:
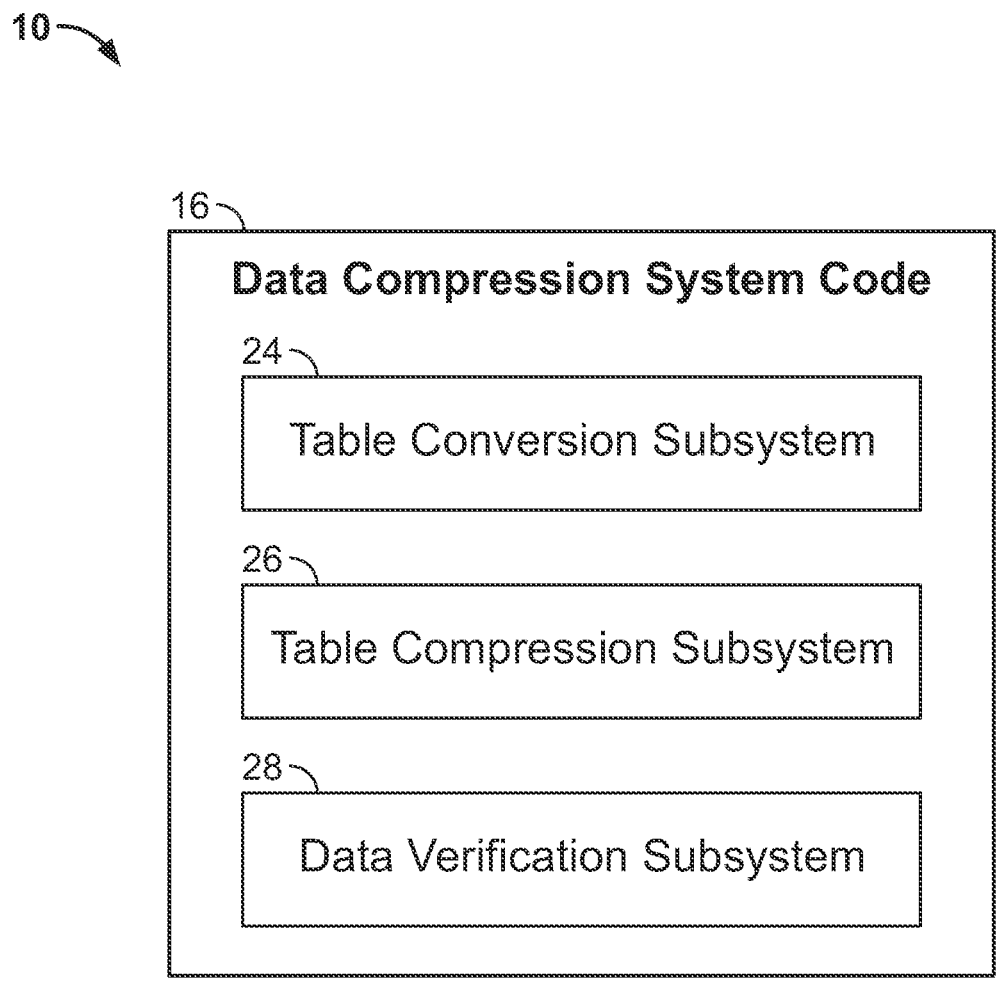
FIG. 2 is a diagram illustrating data compression system code executed by the system of the present disclosure.

FIG. 2 is a diagram illustrating software modules of the data compression system code 16 of system 10. Data compression system code 16 (e.g., non-transitory, computer-readable instructions) is stored on a computer-readable medium and executable by a hardware processor or one or more computer systems, such as data compression server(s) 14. As discussed above, the code 16 can communicate with the data generation system(s) 12, the storage database 18, and the data decompression server(s) 20, could be stored on the same computer system, or could be stored on one or more other computer systems in communication with the code 16. The code 16 can include various custom-written software modules that carry out the steps/processes discussed herein, and could include, but are not limited to, a table conversion subsystem 24, a table compression subsystem 26, and a data verification subsystem 28. The table conversion subsystem 24 can be configured to receive a table of uncompressed numeric information (hereinafter "raw data") including non-integer values, for example, from the data generation system(s) 12, and convert the raw data into a rectangular table of integers. Those of ordinary skill in the art will understand that there are a plurality of methods for converting non-integer values (e.g., floating numbers) into integer values, for example, by breaking single digits, powers of ten, and so forth into two or more columns. Furthermore, additional methods can be employed to integrate other data types such as date, time, and string, so that the systems and methods of the present disclosure can be applied thereto. The table compression subsystem 26 can be configured to reduce the size (e.g., the number of bytes) of the raw data table, as described in connection with FIG. 3, and the data verification subsystem 28 can be configured to verify that no data was lost or corrupted during the compression process.

The data compression system code 16 can be implemented as an algorithm, described herein as a plurality of steps (see FIG. 3), but can also be implemented as a single-pass algorithm, requiring reduced computational resources during execution. The code 16 can be programmed using any suitable programming languages including, but not limited to, C, C++, C#, Java, Python or any other suitable language. Additionally, the code 16 could be distributed across multiple computer systems in communication with each other over a communications network, and/or stored and executed on a cloud computing platform and remotely accessed by a computer system in communication with the cloud platform.

Figure 3:
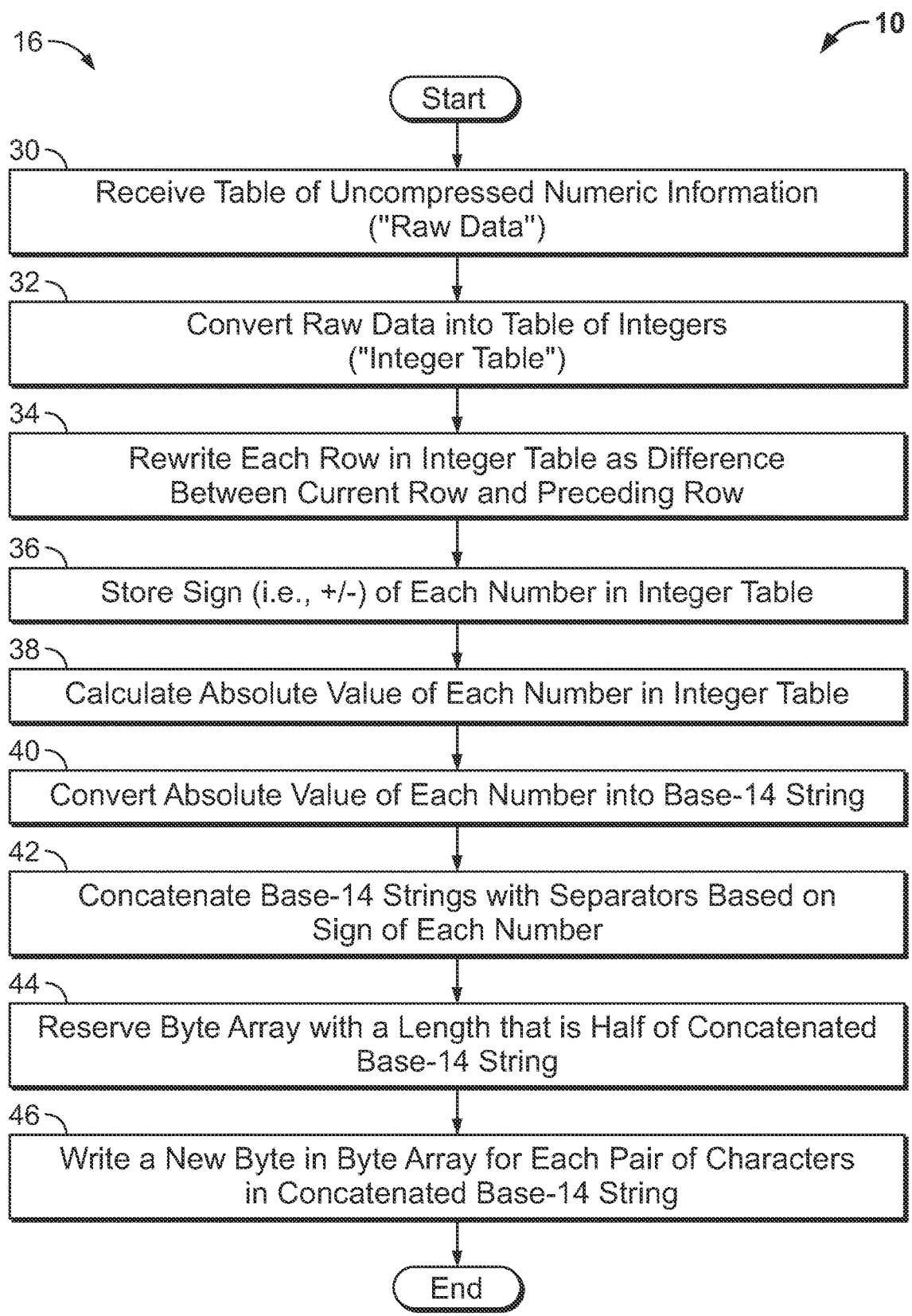
FIG. 3 is a flowchart illustrating overall process steps carried out by the system of the present disclosure.

FIG. 3 is a flowchart illustrating overall processing steps carried out by the data compression system code 16 of the system 10 of the present disclosure. In step 30, the system 10 receives a table of uncompressed numeric information ("raw data") including non-integer values and in step 32, the system 10 converts the raw data into a table including only integer values ("integer table"), as described above in connection with the table conversion subsystem 24 shown in FIG. 2. In step 34, the system rewrites each row in the integer table as the difference between the integer values in a current row of the integer table and the integer values in a preceding row of the integer table. In step 36 the system stores the sign (i.e., positive or negative) of each number in the integer table. In step 38, the system calculates the absolute value of each number in the integer table and in step 40, the system converts the absolute value of each number into a base-14 (i.e., tetradecimal) string. For example, steps 38 and 40 described herein can be implemented using the following method in the java programming language: java.lang.Integer.toString(int radix). Those of ordinary skill in the art will understand that other programming languages can be employed, with similar result, while having alternative implementations and not departing from the scope of the present disclosure. In step 42, the system 10 concatenates the base-14 strings, one after the other, into a new string that includes separators between the base-14 strings that are based on the original sign of each number that was stored in step 36 above. Specifically, if the original value was negative, an "E" separator can be used and if the original value was positive, or zero, an "F" separator can be used. As such, step 42 generates a new string with hexadecimal values from "0" to "F." In step 44, the system 10 reserves a new byte array with a length that is half the length of the concatenated base-14 string. In step 46, the system 10 runs through the concatenated base-14 string, reading characters by pairs, and writes a new byte in the reserved byte array for each pair of characters in the concatenated base-14 string. Specifically, each new byte has its high nibble assigned to the first character of each pair and its low nibble assigned to the second character of each pair. It should be understood that a nibble is a set of four bits, or half an octet, in which bytes are divided. Following existing conventions, bytes include a high nibble and a low nibble, and each nibble can save up to 16 different values, such that they can be represented as an hexadecimal digit from "0h" to "Fh." The separators between the rows and columns described herein are half of the size, as compared to their representation as text, because they occupy four bits (e.g., a nibble) instead of eight bits (e.g., a fully byte). Likewise, sign symbols that usually occupy one full character in text files, and one bit when represented in binary, can be embedded in a separator symbol. According to some embodiments of the present disclosure, the compressed file generated by the system 10 can also include metadata as a prefix or suffix, indicating information about the content of the file. For example, the metadata can include the number of columns, the meaning of each column, and the like. After the system 10 has written a new byte in the reserved byte array for each pair of the characters in the concatenated base-14 string, the process ends.

With respect to decompression of data, the foregoing steps discussed in connection with FIG. 3 can be performed in reverse order in order to decompress data. For example, the metadata prefix or suffix can be separated from the compressed byte array and the resulting byte array can then be converted into a hexadecimal string. The position of the first separator symbol (e.g., "E" or "F") can be identified in the hexadecimal string. Then, the substring from the first byte of this separator can be converted from a base-14 string into an integer and negated if the separator was an "E" symbol. The resulting number can be stored in an integer list. These same process steps can then be repeated, moving to the next symbol after the previous separator, processing the remaining byte array until the whole of the input data is processed. The resulting integer list can broken into an integer table, depending on the number of columns. The integer table can be obtained by writing each row in a new table, adding each integer value of the row to the integer value in the same column of the previous row. Finally, each integer value is converted into its correct data type by executing a reverse conversion of the integer into an original data type (e.g., floating number, string, date, time, etc.).

Thus, the resulting table contains the original, uncompressed, numeric information.

Table 1 illustrates the compression ratios for various integer values, according to the systems and methods of the present disclosure.

TABLE 1

| Compression ratio for number 0 | 0% - this number is not written, and only the separator is left |
|---|---|
| Compression ratio for numbers lower than 14 (10 base 14) | 40.0% |
| Compression ratio for numbers lower than 196 (100 base 14) | 39.6% |
| Compression ratio for numbers lower than 2,744 (1,000 base 14) | 40.6% |
| Compression ratio for numbers lower than 38,416 (10,000 base 14) | 41.6% |
| Compression ratio for numbers lower than 537,824 (100,000 base 14) | 42.4% |
| Compression ratio for numbers lower than 7,529,536 (1,000,000 base 14) | 43.2% |
| Compression ratio for numbers lower than 105,413,504 (10,000,000 base 14) | 43.5% |

Tables 2 and 3 illustrate comparisons of compression ratios provided by the systems and methods of the present disclosure and other currently available data compression algorithms on random data samples. Specifically, Table 2 illustrates a comparison of the compression rations provided by the present disclosure and the currently available data compression algorithms for a text file having 630895 rows and 9 columns, with partially ordered data.

TABLE 2

Original Text File Size: 31321679

| Program | Size After Compression | Compression Ratio |
|---|---|---|
| DEFLATE | 7720832 | 24% |
| RAR | 6719386 | 21% |
| 7ZIP | 4857996 | 15% |
| Present Disclosure | 5419505 | 17% |
| Present Disclosure + DEFLATE | 3091924 | 9% |

Table 3 illustrates a comparison of the compression rations provided by the present disclosure and the currently available data compression algorithms for a text file having 985432 rows and 18 columns, with generally randomized data.

TABLE 3

Original Text File Size: 82591125

| Program | Size After Compression | Compression Ratio |
|---|---|---|
| DEFLATE | 27458683 | 33% |
| RAR | 24588288 | 30% |
| 7ZIP | 20443177 | 25% |
| Present Disclosure | 27150602 | 32% |
| Present Disclosure + DEFLATE | 23843996 | 28% |

As illustrated above in Tables 2 and 3, the compression ratios provided by the systems and methods of the present disclosure, like all compression algorithms, can vary depending on the ordering of the raw data; the more ordered the raw data, the better. The compression provided by the systems and methods of the present disclosure is particularly favorable when the data has, at least, some amount of ordering (e.g., numbers are not very different between rows).

Additionally, the systems and methods of the present disclosure can be used in combination with one or more additional compression algorithms. For example, as shown in Tables 2 and 3, the data that has been compressed by the system 10 can be re-compressed by concatenating another compression system, such as DEFLATE, 7ZIP or RAR, thereby improving the compression ration of the data. This is possible because compressed data provided by the system 10 can still contain regular patterns, which can be detected by other specialized algorithms to further compress the data.

Figure 4:
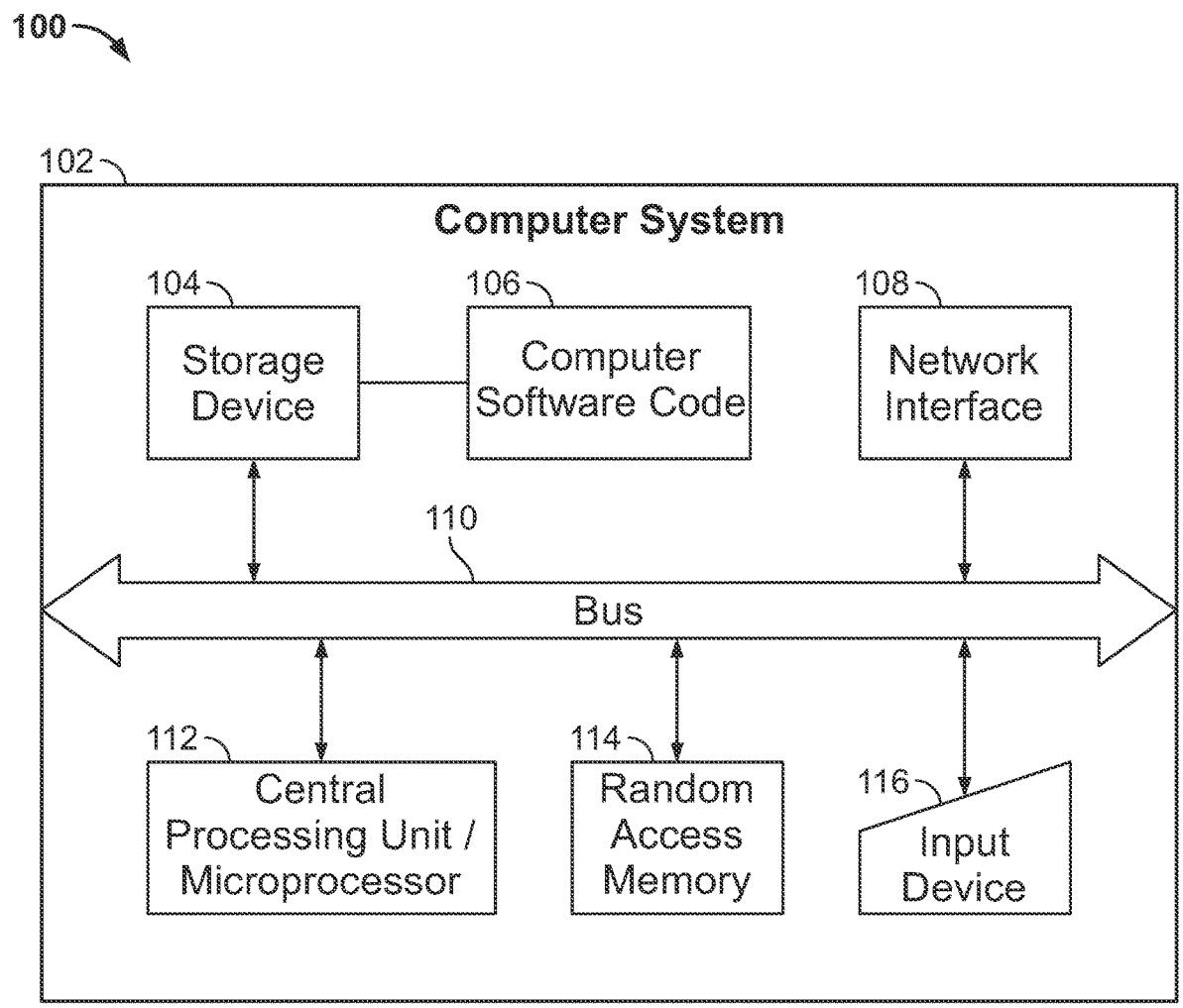
FIG. 4 is a diagram illustrating hardware and software components capable of being utilized to implement an embodiment of the system of the present disclosure.

FIG. 4 is a diagram 100 showing hardware and software components of a computer system 102 on which the system 10 of the present disclosure can be implemented. The computer system 102 can include a storage device 104, computer software code 106, a network interface 108, a communications bus 110, a central processing unit (CPU) (microprocessor) 112, random access memory (RAM) 114, and one or more input devices 116, such as a keyboard, mouse, etc. It is noted that the CPU 112 could also include, or be configured as, one or more graphics processing units (GPUs). The computer system 102 could also include a display (e.g., liquid crystal display (LCD), cathode ray tube (CRT), and the like). The storage device 104 could comprise any suitable computer-readable storage medium, such as a disk, non-volatile memory (e.g., read-only memory (ROM), erasable programmable ROM (EPROM), electrically-erasable programmable ROM (EEPROM), flash memory, field-programmable gate array (FPGA), and the like). The computer system 102 could be a networked computer system, a personal computer, a server, a smart phone, tablet computer, etc. It is noted that the server 102 need not be a networked server, and indeed, could be a stand-alone computer system.

The functionality provided by the present disclosure could be provided by computer software code 106, which could be embodied as computer-readable program code (e.g., algorithm) stored on the storage device 104 and executed by the CPU 112 using any suitable, high or low level computing language, such as Python, Java, C, C++, C#, .NET, MATLAB, etc. The network interface 108 could include an Ethernet network interface device, a wireless network interface device, or any other suitable device which permits the computer system 102 to communicate via a network (e.g., communication network 22, shown in FIG. 1). The CPU 112 could include any suitable single-core or multiple-core microprocessor of any suitable architecture that is capable of implementing and running the computer software code 106 (e.g., Intel processor). The random access memory 114 could include any suitable, high-speed, random access memory typical of most modern computers, such as dynamic RAM (DRAM), etc.

Having thus described the systems and methods in detail, it is to be understood that the foregoing description is not intended to limit the spirit or scope thereof. It will be understood that the embodiments of the present disclosure described herein are merely exemplary and that a person skilled in the art can make any variations and modification without departing from the spirit and scope of the disclosure. All such variations and modifications, including those discussed above, are intended to be included within the scope of the disclosure.

What is claimed is:

1. A system for lossless compression of tabular numeric data, comprising:
   a memory; and a processor in communication with the memory, the processor:
receiving a table of uncompressed numeric information;
generating a table of integers based on the table of uncompressed numeric information;
rewriting each row in the table of integers based on a difference between values in a first row and values in a preceding row;
converting an absolute value of each number in the table of integers into one or more strings;
concatenating the strings for each number;
writing a byte in a new byte array for each pair of characters in the concatenated string; and
exporting the new byte array as a compressed data file.

2. The system of claim 1, wherein the processor stores a sign of each number in the table of integers.

3. The system of claim 1, wherein the processor calculates the absolute value of each number in table of integers.

4. The system of claim 1, wherein the processor concatenates the strings for each number by concatenating a base-14 string with separators based on the sign of each number.

5. The system of claim 4, wherein the processor reserves the new byte array with a length that is half of the concatenated base-14 string.

6. The system of claim 5, wherein the processor writes the byte in the new byte array for each pair of characters in the concatenated base-14 string.

7. A method for lossless compression of tabular numeric data, comprising the steps of:
receiving at a processor a table of uncompressed numeric information;
generating by the processor a table of integers based on the table of uncompressed numeric information;
rewriting by the processor each row in the table of integers based on a difference between values in a first row and values in a preceding row;
converting by the processor an absolute value of each number in the table of integers into one or more strings;
concatenating by the processor the strings for each number;
writing by the processor a byte in a new byte array for each pair of characters in the concatenated string; and
exporting by the processor the new byte array as a compressed data file.

8. The method of claim 7, further comprising storing by the processor a sign of each number in the table of integers.

9. The method of claim 7, further comprising calculating by the processor the absolute value of each number in table of integers.

10. The method of claim 7, further comprising concatenating by the processor the strings for each number by concatenating a base-14 string with separators based on the sign of each number.

11. The method of claim 10, further comprising reserving by the processor the new byte array with a length that is half of the concatenated base-14 string.

12. The method of claim 11, further comprising writing by the processor the byte in the new byte array for each pair of characters in the concatenated base-14 string.

13. A non-transitory, computer-readable medium having computer-readable instructions stored thereon which, when executed by a processor, cause the processor to perform the steps of:
receiving at the processor a table of uncompressed numeric information;
generating by the processor a table of integers based on the table of uncompressed numeric information;
rewriting by the processor each row in the table of integers based on a difference between values in a first row and values in a preceding row;
converting by the processor an absolute value of each number in the table of integers into one or more strings;
concatenating by the processor the strings for each number;
writing by the processor a byte in a new byte array for each pair of characters in the concatenated string; and
exporting by the processor the new byte array as a compressed data file.

14. The computer-readable medium of claim 13, further comprising storing by the processor a sign of each number in the table of integers.

15. The computer-readable medium of claim 13, further comprising calculating by the processor the absolute value of each number in table of integers.

16. The computer-readable medium of claim 13, further comprising concatenating by the processor the strings for each number by concatenating a base-14 string with separators based on the sign of each number.

17. The computer-readable medium of claim 16, further comprising reserving by the processor the new byte array with a length that is half of the concatenated base-14 string.

18. The computer-readable medium of claim 17, further comprising writing by the processor the byte in the new byte array for each pair of characters in the concatenated base-14 string.

* * * * *